(12) United States Patent
Tanaka

(10) Patent No.: US 10,727,152 B2
(45) Date of Patent: Jul. 28, 2020

(54) SEMICONDUCTOR APPARATUS

(71) Applicant: Mitsubishi Electric Corporation, Tokyo (JP)

(72) Inventor: Hiroki Tanaka, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/939,376

(22) Filed: Mar. 29, 2018

(65) Prior Publication Data
US 2019/0103334 A1 Apr. 4, 2019

(30) Foreign Application Priority Data

Sep. 29, 2017 (JP) .................................. 2017-190985

(51) Int. Cl.
| | | |
|---|---|---|
| H01L 23/34 | (2006.01) | |
| H01L 23/367 | (2006.01) | |
| H01L 23/24 | (2006.01) | |
| H01L 23/29 | (2006.01) | |
| H01L 23/00 | (2006.01) | |

(Continued)

(52) U.S. Cl.
CPC .......... *H01L 23/3675* (2013.01); *H01L 23/04* (2013.01); *H01L 23/053* (2013.01); *H01L 23/08* (2013.01); *H01L 23/24* (2013.01); *H01L 23/293* (2013.01); *H01L 23/3735* (2013.01); *H01L 24/32* (2013.01); *H01L 23/3737* (2013.01); *H01L 23/49861* (2013.01); *H01L 24/29* (2013.01); *H01L 24/48* (2013.01); *H01L 24/49* (2013.01); *H01L 24/73* (2013.01); *H01L 25/0655* (2013.01); *H01L 2224/29101* (2013.01); *H01L 2224/32225* (2013.01); *H01L 2224/32245* (2013.01); *H01L 2224/48227* (2013.01); *H01L 2224/48247* (2013.01); *H01L 2224/4911* (2013.01); *H01L 2224/49433* (2013.01); *H01L 2224/73265* (2013.01); *H01L 2924/00014* (2013.01); *H01L 2924/10253* (2013.01); *H01L 2924/10272* (2013.01);

(Continued)

(58) Field of Classification Search
CPC ....................................................... H01L 23/34
See application file for complete search history.

(56) References Cited

U.S. PATENT DOCUMENTS

| | | | |
|---|---|---|---|
| 2010/0327455 A1 | 12/2010 | Nishihata et al. | |
| 2013/0009168 A1* | 1/2013 | Tsuchiya .............. | H01L 23/473 257/77 |
| 2013/0240909 A1 | 9/2013 | Hiramatsu et al. | |

FOREIGN PATENT DOCUMENTS

| | | | | |
|---|---|---|---|---|
| DE | 11 2011 103 926 T5 | 10/2013 | | |
| JP | 2005-056873 A | 3/2005 | | |
| JP | 2005056873 A | * 3/2005 | ............. | H01L 24/29 |

OTHER PUBLICATIONS

An Office Action mailed by the German Patent and Trademark Office dated May 8, 2020, which corresponds to German Patent Application No. 10 2018 207 532.8 and is related to U.S. Appl. No. 15/939,376.

* cited by examiner

Primary Examiner — Moazzam Hossain
Assistant Examiner — Hajar Kolahdouzan
(74) Attorney, Agent, or Firm — Studebaker & Brackett PC

(57) ABSTRACT

A semiconductor apparatus includes: a radiator plate; a resin insulating layer provided on the radiator plate; a resin block made of resin and armularly disposed to cover an end part of the radiator plate and an end part of the resin insulating layer (Continued)

layer; a case disposed to cover the resin block; and a sealing material filled in an inside of the case.

17 Claims, 8 Drawing Sheets

(51) Int. Cl.
*H01L 23/08* (2006.01)
*H01L 23/053* (2006.01)
*H01L 23/04* (2006.01)
*H01L 23/373* (2006.01)
*H01L 25/065* (2006.01)
*H01L 23/498* (2006.01)

(52) U.S. Cl.
CPC ............... *H01L 2924/181* (2013.01); *H01L 2924/19107* (2013.01); *H01L 2924/35121* (2013.01)

SEMICONDUCTOR APPARATUS

BACKGROUND OF THE INVENTION

Field

The present invention relates to a power semiconductor apparatus having a radiator plate.

Background

In a conventional power semiconductor apparatus having a radiator plate, a wiring layer having a circuit pattern is formed on the radiator plate with a function of radiating heat to the outside via a resin insulating layer which insulates the radiator plate from conducting parts inside the apparatus. On the wiring layer, semiconductor devices are implemented via a solder. The semiconductor devices are connected to the wiring layer through wire bonding, which form the conducting parts. A case is bonded to the resin insulating layer via an adhesive material. There is a technology in which the conducting parts, which are inside the case, are sealed with sealing resin having small linear expansion coefficient (for example, see JP 2005-056873 A).

SUMMARY

A conventional semiconductor apparatus uses semiconductor devices having smaller linear expansion coefficient than other components. This causes distortion and stress between the semiconductor devices and peripheral components due to a difference in amount of expansion and contraction therebetween when the temperature of the semiconductor apparatus changes. However, the semiconductor devices and the peripheral components adjacent to the semiconductor devices are sealed with sealing resin having small linear expansion coefficient. Accordingly, distortion and stress arising between the semiconductor devices and the peripheral components are suppressed.

Meanwhile, the resin insulating layer, which generally has the next lower linear expansion coefficient to a semiconductor chip, cannot be covered with the sealing resin in terms of its structural feature. This is because, an adhesive material is applied on the surface of the resin insulating layer, and the case is bonded to the resin insulating layer with the adhesive material, in an integrated substrate in which the wiring layer having a circuit pattern is implemented on the radiator plate via the resin insulating layer. The surface, of the resin insulating layer, that is positioned more inward of the semiconductor apparatus than the adhesive material is covered with the sealing resin since the resin with which the interior of the semiconductor apparatus is to be sealed is used to seal the case after the case is bonded. Nevertheless, an end part of the resin insulating layer, that is positioned more on the peripheral side of the semiconductor apparatus than the adhesive material cannot be covered with the sealing resin. Therefore, peeling-off or cracks cannot be suppressed at the interface between the resin insulating layer and the radiator plate. Temperature change in a power semiconductor apparatus itself has been increasing. Hence, it is needed to suppress peeling-off or cracks at the end part of the interface between the resin insulating layer and the radiator plate.

The present invention is devised in order to solve the aforementioned problems, and an object thereof is to provide a semiconductor apparatus having a radiator plate and capable of suppressing peeling-off or cracks arising at an end part of a bonding part of a resin insulating layer and the radiator plate.

The semiconductor apparatus according to the present invention includes: a radiator plate; a resin insulating layer provided on the radiator plate; a resin block made of resin and annularly disposed to cover an end part of the radiator plate and an end part of the resin insulating layer; a case disposed to cover the resin block; and a sealing material filled in an inside of the case.

In the semiconductor apparatus according to the present invention, the annularly resin block made of resin is fixed to the end part of the radiator plate and the end part of the resin insulating layer. This can thereby suppress distortion arising between the end part of the radiator plate and the end part of the resin insulating layer when the temperature changes in operation of the semiconductor apparatus, and suppress peeling-off or cracks at the interface between the radiator plate and the resin block.

DESCRIPTION OF EMBODIMENTS

First Embodiment

Figure 1:
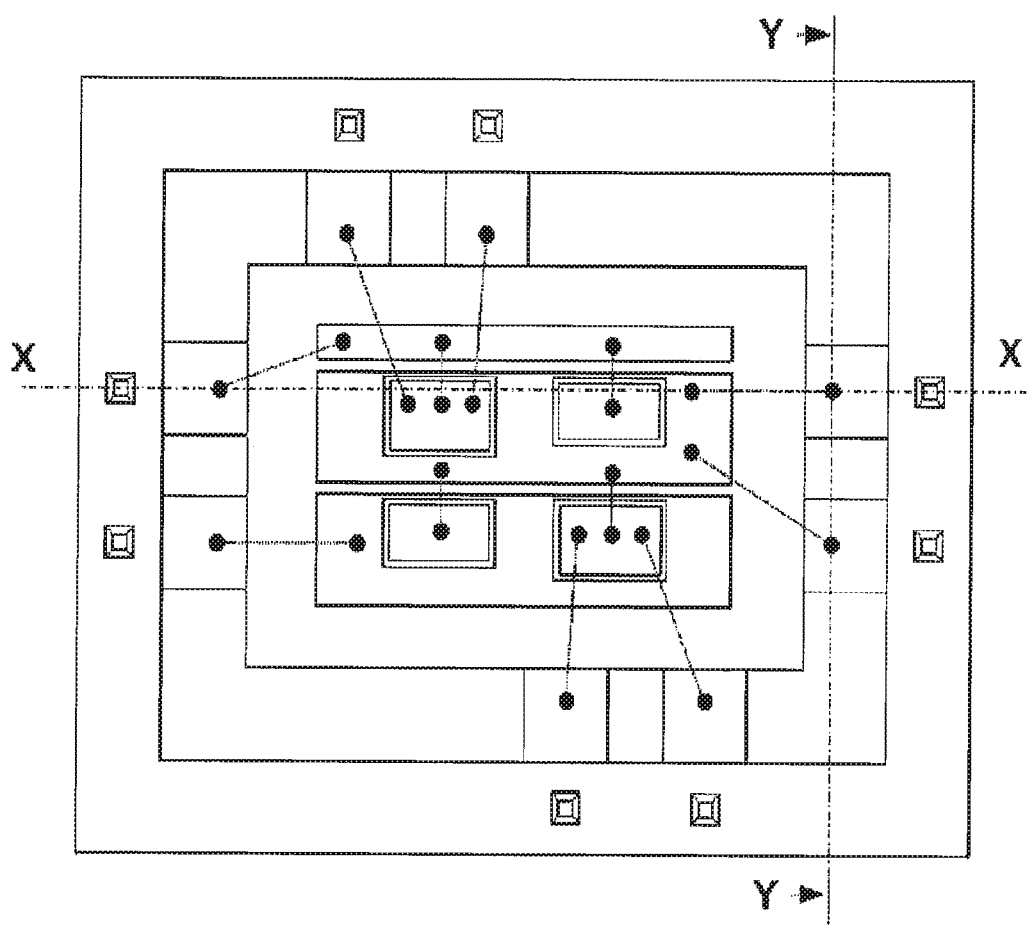
FIG. 1 is a configuration diagram of a semiconductor apparatus according to the first embodiment of the present invention.
Figure 2:
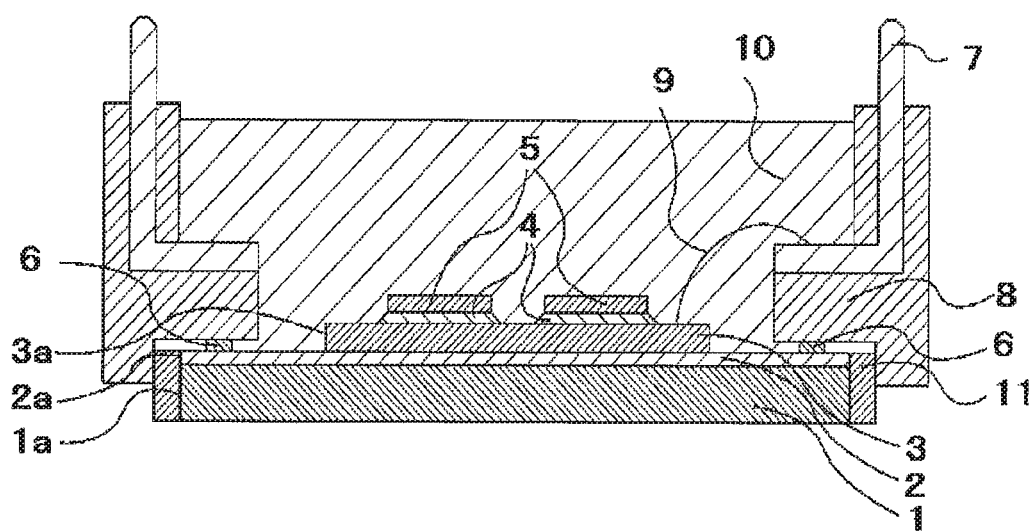
FIG. 2 is a cross-sectional view of a semiconductor apparatus according to the first embodiment of the present invention.

First, a configuration of a semiconductor apparatus 100 according to a first embodiment of the present invention is described. FIG. 1 is a configuration diagram of a semiconductor apparatus according to the first embodiment of the present invention. FIG. 2 is a cross-sectional view taken along the line X-X illustrated in FIG. 1.

The semiconductor apparatus 100 includes a heat radiation board in which a wiring layer 3 having a circuit pattern is implemented on a radiator plate 1 made of copper via a resin insulating layer 2. Semiconductor devices 5 are joined to the wiring layer 3 via a solder 4. A case 8 including terminals 7 is joined to the resin insulating layer 2 via adhesive material 6. The terminals 7, the semiconductor devices 5 and the wiring layer 3 are connected to one another with bonding wires 9. The inside of the case 8 is filled with a sealing material 10. Notably, an end part 3a of the wiring layer 3 is positioned more inward of the semiconductor apparatus as compared with an end part 1a of the radiator plate 1 and an end part 2a of the resin insulating layer 2. The aforementioned positional relation between the end parts leads to an effect of securing a creeping distance between the wiring layer 3 and the radiator plate 1 to enhance insulation between the wiring layer 3 and the radiator plate 1. The end part 1a of the radiator plate 1 and the end part 2a of the resin insulating layer 2 are positioned on the same plane. An resin block 11 is annularly disposed so as to cover the whole peripheries of the end part 1a of the radiator plate 1 and the end part 2a of the resin insulating layer 2. The resin block 11 is fixed to the end part 1a of the radiator plate 1 and the end part 2a of the resin insulating layer 2. The resin block 11 is made of epoxy-based resin having good bonding property to the resin insulating layer 2 and the radiator plate 1. For reasons mentioned later, the resin block 11 desirably has a Young's modulus not less than 10 [GPa] and a linear expansion coefficient not more than $30 \times 10^{-6}$ [/K].

The resin block 11 provided in the semiconductor apparatus 100 according to the first embodiment achieves an effect of suppressing peeling-off or cracks at the interface between the resin insulating layer 2 and the radiator plate 1 which are caused by a difference in linear expansion coefficient between the resin insulating layer 2 and the radiator plate 1.

First, a mechanism by which peeling-off or cracks arise at the interface between the resin insulating layer 2 and the radiator plate 1 is described. Such peeling-off or cracks arise due to stress or distortion caused by a difference in linear expansion coefficient between the resin insulating layer 2 and the radiator plate 1 when the temperature of the semiconductor apparatus changes.

The semiconductor apparatus 100 according to the first embodiment allows heat generated from the inside of the semiconductor apparatus in operation of the semiconductor apparatus to be radiated from the radiator plate 1 via the wiring layer 3 and the resin insulating layer 2. Through this process of heat radiation, die temperature of the semiconductor apparatus 100 rises.

Meanwhile, after the semiconductor apparatus suspends its operation and the heat is radiated through the same path as above, the temperature of the semiconductor apparatus 100 falls down to a temperature equivalent to an ambient temperature. Then, in operation of the semiconductor apparatus, the temperature rises again. After that, a rise of the temperature and a fail of the temperature are repeated.

Assuming that one cycle is a heat cycle from a rise of the temperature to the next rise of the temperature, accumulated distortion arises between the resin insulating layer 2 and the radiator plate 1 in proportion to the number of cycles. When the magnitude of the accumulated distortion exceeds bonding strength, peeling-off or cracks arise at the interface between the resin insulating layer 2 and the radiator plate 1.

Next, operation and effects of the resin block 11 provided in the semiconductor apparatus 100 are described. The resin block 11 is fixed to the end part 1a of the radiator plate 1 and the end part 2a of the resin insulating layer 2 which form the same plane. In other words, the bonding surface of the resin block 11 to the radiator plate 1 and the resin insulating layer 2 forms a flat surface without irregularities. The bonding surface forms such a flat surface without irregularities, and thereby, the resin block 11 can receive stress from the radiator plate 1 and the resin insulating layer 2, which expand and contract, with the stress distributed over the bonding surface. This can suppress deformation due to the stress, which enables the resin block 11 to be durable against larger stress than conventional ones. In other words, the resin block 11 acts to maintain the flatness of the bonding surface, and thereby, exerts stress thereon such that the bonding surface recovers the same plane on the end part 1a of the radiator plate 1 and the end part 2a of the resin insulating layer 2, which are different in amount of expansion and contraction from each other.

An action of elongation of each component when the temperature of the semiconductor apparatus 100 according to the first embodiment rises is described. After a component composed of a flat plate which has a periphery L [m] is heated, a periphery L' [m] of the component after heating is approximated by $L'=L[1+(\alpha \times \Delta T)]$, where $\Delta T$ [° C.] is a temperature change and $\alpha$ [/K] is a linear expansion coefficient.

In the semiconductor apparatus 100 according to the first embodiment of the present invention, the relation of L1=L2=L3 will be satisfied, when L1 [m] is an inner peripheral length of the resin block 11 before a rise of a temperature, L2 [m] is a peripheral length of the radiator plate 1 before the rise of the temperature, and L3 [m] is a peripheral length of the resin insulating layer 2 before the rise of the temperature. Assuming that the relation of L1=L2=L3=1 [m] will be satisfied, A [/K] is set to be a linear expansion coefficient of the resin block 11, B [/K] is set to be a linear expansion coefficient of the radiator plate 1, and C [/K] is set to be a linear expansion coefficient of the resin insulating layer 2. In such a case, when the temperature rises from 25[° C.] to 175[° C.], the inner peripheral length L1' of the resin block 11 after the rise of the temperature can be approximated by $L1'=1+(A \times 150)$ [m], the peripheral length L2' of the radiator plate 1 after the rise of the temperature is by $L2'=1+(A \times 150)$ [m], and the peripheral length L3' of the resin insulating layer 2 after the rise of the temperature is by $L3'=1+(C \times 150)$ [m], ignoring stress at the respective bonding parts.

In other words, when the linear expansion coefficient A of the resin block 11 is larger than the linear expansion coefficient B of the radiator plate 1 and the linear expansion coefficient C of the resin insulating layer 2, the inner peripheral length of the resin block 11 will become larger than the peripheral length of the radiator plate 1 and the peripheral length of the resin insulating layer 2.

Considering the case where the components are actually joined, the bonding part of the radiator plate 1 and the resin insulating layer 2 generates stress such that the difference between the peripheral lengths becomes small. Hence, while this difference becomes smaller than the difference between the peripheral lengths based on the aforementioned expressions, distortion arises due to the stress in elongation. This causes, by this distortion, a displacement between the end part 1a of the radiator plate 1 and the end part 2a of the resin insulating layer 2.

The resin block 11 acts to maintain the flatness of the bonding surface between the resin block 11 and the aforementioned end parts. Hence, the end parts of the radiator plate 1 and the resin insulating layer 2 also act to suppress the distortion.

Herein, as to the linear expansion coefficient required for the resin block 11, it is desirable for the linear expansion coefficient of the resin block 11 to be $30 \times 10^{-6}$ [/K] or less. The linear expansion coefficient of the radiator plate 1 made of copper is approximately $16 \times 10^{-6}$ [/K]. If the linear expansion coefficient of the resin block 11 is $30 \times 10^{-6}$ [/K] or more, a difference between the amount of expansion and contraction of those possibly causes peeling-off or cracks at the interface between the resin block 11 and the radiator plate 1.

On the other hand, when the linear expansion coefficient A of the resin block 11 is smaller than the linear expansion coefficient B of the radiator plate 1 and the linear expansion coefficient C of the resin insulating layer 2, the inner peripheral length of the resin block 11 will become smaller than the peripheral length of the radiator plate 1 and the peripheral length of the resin insulating layer 2.

In the above case, the resin block 11 exerts pushing stress in a direction opposite to the elongation direction on the end part 1a of the radiator plate 1 and the end part 2a of the resin insulating layer 2.

The resin block 11 acts to maintain the flatness of the bonding surface of the aforementioned end pads. Hence, the end parts of the radiator plate 1 and the resin insulating layer 2 also act to suppress the distortion.

Furthermore, an action is described in the case where the linear expansion coefficient A of the resin block 11, the linear expansion coefficient B of the radiator plate 1, and the linear expansion coefficient C of the resin insulating layer 2 will satisfy relation of C<A<B.

In the above case, the resin block 11 pushes the end part 1a of the radiator plate 1, whose peripheral length most elongates, in a direction opposite to its elongation direction. Meanwhile, the resin block 11 pulls the end part 2a of the resin insulating layer 2, whose peripheral length least elongates, in a direction opposite to its elongation direction. Thereby, the resin block 11 acts to maintain the flatness of the bonding surface of the end parts.

Subsequently, an action when the temperature of the semiconductor apparatus 100 falls is described. After the temperature falls, the periphery of the component composed of a flat plate is expressed as $L'=L[1+(\alpha+\Delta R)]$. In the semiconductor apparatus 100 according to the first embodiment of the present invention, when L1 [m] is an inner peripheral length of the resin block 11 before a fall of a temperature, L2 [m] is a peripheral length of the radiator plate 1 before the fall of the temperature, and L3 [m] is a peripheral length of the resin insulating layer 2 before the fall of the temperature, the relation of L1=L2=L3 will be satisfied. Now, it is assumed that the relation of L1=L2=L3=1 [m] is satisfied, the linear expansion coefficient of the resin block 11 is A [/K], the linear expansion coefficient of the radiator plate 1 is B [/K], and the linear expansion coefficient of the resin insulating layer 2 is C [/K]. In such a case, when the temperature rises from 25[° C.] to 175[° C.], the inner peripheral length L1' of the resin block 11 after the fall of the temperature can be approximated by $L1'=1-(A\times150)$ [m], the peripheral length L2' of the radiator plate 1 after the fall of the temperature is by $L2'=1-(B\times150)$ [m], and the peripheral length L3' of the resin insulating layer 2 after the fall of the temperature is by $L3'=1-(C\times150)$ [m], ignoring stress at bonding parts of those.

When the linear expansion coefficient A of the resin block 11 is larger than the linear expansion coefficient B of the radiator plate 1 and the linear expansion coefficient C of the resin insulating layer 2, the inner peripheral length of the resin block 11 becomes smaller than the peripheral length of the radiator plate 1 and the peripheral length of the resin insulating layer 2, which indicates inverse relation to that at a rise of the temperature.

In other words, an action in the case where the linear expansion coefficient A of the resin block 11 at a fall of the temperature is larger than the linear expansion coefficient B of the radiator plate 1 and the linear expansion coefficient C of the resin insulating layer 2 is similar to the action in the ease where the linear expansion coefficient A of the resin block 11 at a rise of the temperature is smaller than the linear expansion coefficient B of the radiator plate 1 and the linear expansion coefficient C of the resin insulating layer 2.

Likewise, an action in the case where the linear expansion coefficient A of the resin block 11 at a fall of the temperature is smaller than the linear expansion coefficient B of the radiator plate 1 and the linear expansion coefficient C of the resin insulating layer 2 is similar to the action in the case where the linear expansion coefficient A of the resin block 11 at a rise of the temperature is larger than the linear expansion coefficient B of the radiator plate 1 and the linear expansion coefficient C of the resin insulating layer 2.

Furthermore, an action in the case where the linear expansion coefficient A of the resin block 11, the linear expansion coefficient B of the radiator plate 1, and the linear expansion coefficient C of the resin insulating layer 2 at a fall of the temperature will satisfy the relation of C<A<B can also be explained based on the explanation of the action at a rise of the temperature tinder the aforementioned same conditions by reversing the direction of the stress.

Subsequently, the suppression performance of the resin block 11 of the semiconductor apparatus 100 according to the first embodiment against distortion arising between the end part 1a of the radiator plate 1 and the end part 2a of the resin insulating layer 2 is described. The Young's modulus of the resin block 11 affects the suppression performance of the resin block 11 against the distortion. The higher the Young's modulus of the resin block 11 is, the higher the suppression performance against the distortion will be.

As compared with copper, the Young's modulus of the resin insulating layer 2 is extremely small, and it is relatively easy to suppress the amount of expansion and contraction of the resin insulating layer 2. Hence, a Young's modulus required for the resin block 11 is desirably 10 GPa or more at least, considering its ratio relative to the Young's modulus of the radiator plate 1.

According to the above, the resin block 11 acts to suppress distortion arising between the end part 1a of the radiator plate 1 and the end part 2a of the resin insulating layer 2 in any relation between the linear expansion coefficient of the resin block 11, the linear expansion coefficient of the radiator plate 1, and the linear expansion coefficient of the resin insulating layer 2 when the temperature changes.

Subsequently, a molding method of the heat radiation board having the resin block 11 is described. The resin block 11 is molded by injection molding to be fixed to the end part 1a of the radiator plate 1 and the end part 2a of the resin insulating layer 2.

First, an integrated resin insulating board is prepared in which the conductive wiring layer 3 is implemented on the radiator plate 1 via the resin insulating layer 2. Next, the integrated resin insulating board is put in a mold which is processed to meet the outline of the heat radiation board having the resin block 11. Epoxy-based resin molten at high temperature is injected into the mold. After the resin hardens upon cooling, the insulating board is taken out to afford the heat radiation board having the resin block 11.

A manufacturing method of the semiconductor apparatus 100 using the heat radiation board having the resin block 11 is herein omitted since the manufacturing can be performed by a conventional art.

As above, according to the semiconductor apparatus 100 according to the first embodiment, the end part 1a of the radiator plate 1 and the end part 2a of the resin insulating layer 2 are put on the same plane, and the resin block 11 is annularly disposed so as to cover the whole peripheries of those. This can thereby suppress distortion arising between the end part 1a of the radiator plate 1 and the end part 2a of the resin insulating layer 2 when the temperature changes.

Second Embodiment

Figure 3:
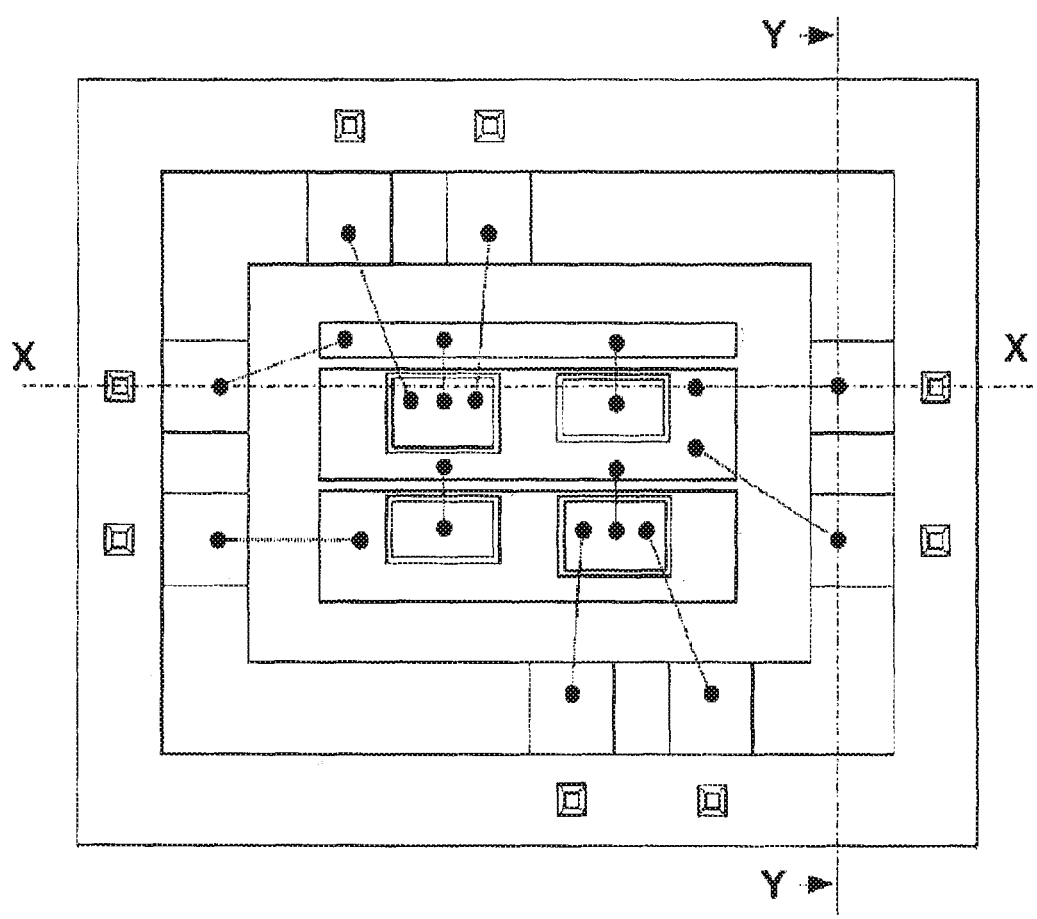
FIG. 3 is a configuration diagram of a semiconductor apparatus according to a second embodiment of the present invention.
Figure 4:
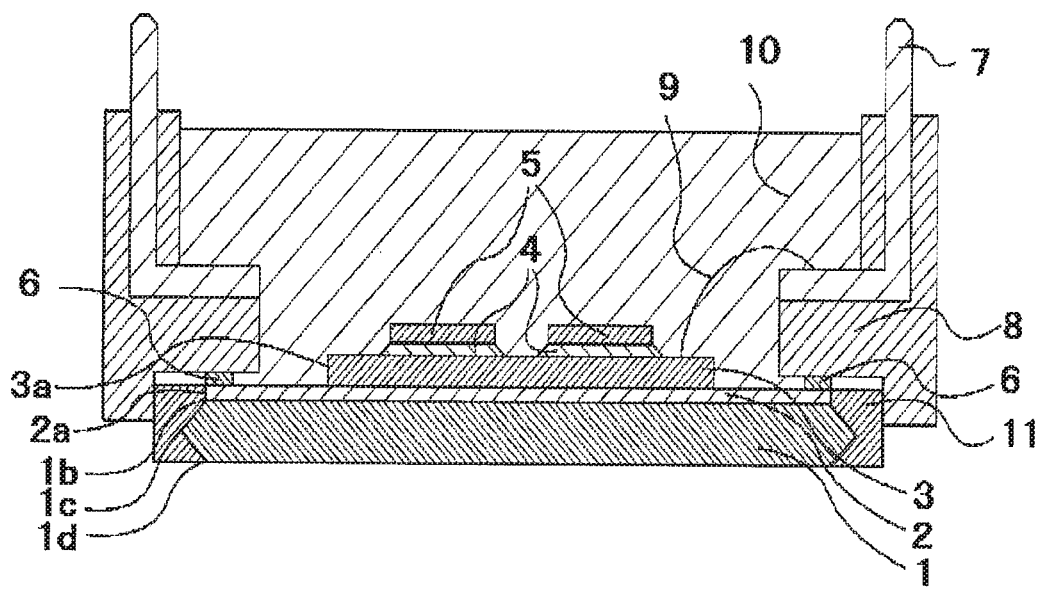
FIG. 4 is a cross-sectional view of a semiconductor apparatus according to a second embodiment of the present invention.

FIG. 3 is a configuration diagram of a semiconductor apparatus according to a second embodiment of the present invention. FIG. 4 is a cross-sectional view taken along the line X-X illustrated in FIG. 3. A semiconductor apparatus 200 according to the second embodiment is different from the semiconductor apparatus according to the first embodiment in the shape of the end part of the radiator plate 1 and the shape of the resin block 11. Notably, in the second embodiment of the present invention, the description of the same parts as or corresponding parts to those described in the first embodiment of the present invention is omitted.

In the semiconductor apparatus 200 according to the second embodiment of the present invention, the end part of the radiator plate 1 implemented in the semiconductor apparatus 200 includes an upper end 1b of the radiator plate 1, a middle end 1c of the radiator plate 1, and a lower end 1d of the radiator plate 1 which are formed to be convex at the center part on the lateral face of the end part. The end part 2a of the resin insulating layer 2 and the upper end 1b of the radiator plate 1 are positioned on the same plane. The resin block 11 is annularly fixed to the end part 2a of the resin insulating layer 2, and the upper end 1b, the middle end 1c and the lower end 1d of the radiator plate 1, and has a concave shape corresponding to the aforementioned convex shape.

Next, operation and effects of the semiconductor apparatus 200 according to the second embodiment are described. The end part of the radiator plate 1 is formed to be convex at the center part on the lateral face of the end part. The end part is covered by the resin block 11 having the recess corresponding to the convex shape. This thereby enhances bonding force between the radiator plate 1 and the resin block 11, which can suppress peeling-off or cracks at the interface between the radiator plate 1 and the resin block 11. Moreover, the end part 2a of the resin insulating layer 2 and the upper end 1b of the radiator plate 1 are disposed on the same plane. This can thereby suppress concentration of stress arising in expansion and contraction. Hence, the resin block 11 can act to maintain the end part 2a of the resin insulating layer 2 and the upper end 1b of the radiator plate 1 to be on the same plane.

As above, according to the semiconductor apparatus 200 according to the second embodiment, the upper end 1b of the radiator plate 1 and the end part 2a of the resin insulating layer 2 are put on the same plane. The resin block 11 having a recess corresponding to the convex shape is annularly disposed on the end part of the radiator plate 1, which is formed to be convex at the center part on the lateral face of the end part thereof; and on the end part 2a of the resin insulating layer 2, so as to cover the whole periphery of those. This can thereby suppress distortion arising between the upper end 1b of the radiator plate 1 and the end part 2a of the resin insulating layer 2 when the temperature changes, which achieves an effect of suppressing peeling-off or cracks at the interface between the resin insulating layer 2 and the radiator plate 1.

Third Embodiment

Figure 5:
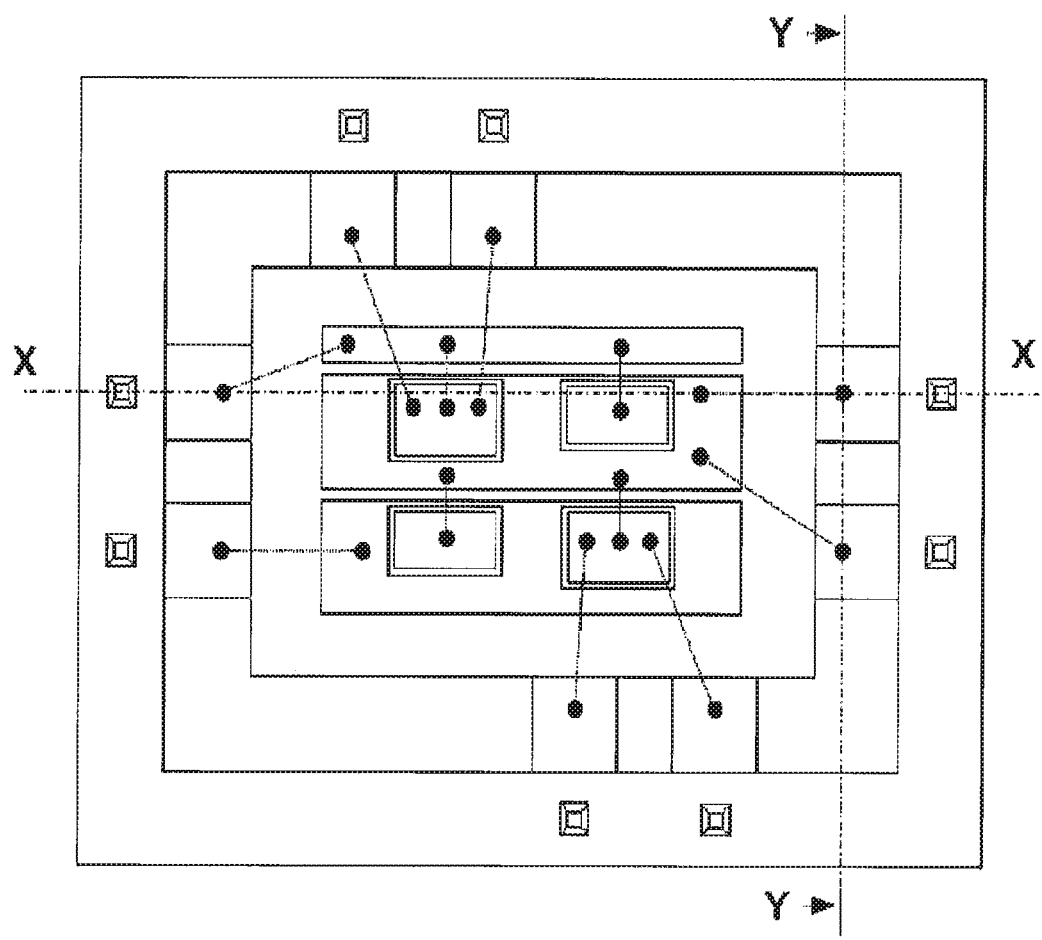
FIG. 5 is a configuration diagram of a semiconductor apparatus according to a third embodiment of the present invention.
Figure 6:
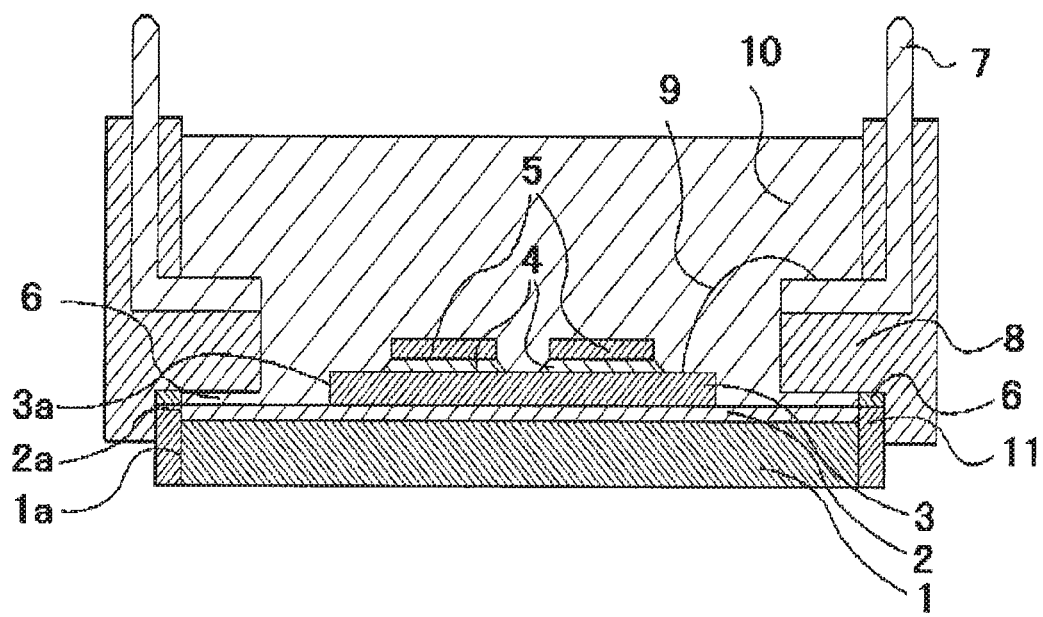
FIG. 6 is a cross-sectional view of a semiconductor apparatus according to a third embodiment of the present invention.

FIG. 5 is a configuration diagram of a semiconductor apparatus according to a third embodiment of the present invention. FIG. 6 is a cross-sectional view taken along the line X-X illustrated in FIG. 5. A semiconductor apparatus 300 according to the third embodiment is different from the semiconductor apparatus according to the first embodiment in a position where the adhesive material 6 is located.

In the semiconductor apparatus 300 according to the third embodiment of the present invention, the case 8 is bonded to the resin block 11 via the adhesive material 6 while in the semiconductor apparatus 100 according to the first embodiment, the case 8 is bonded to the resin insulating layer 2 via the solder 4.

Next, operation and effects of the semiconductor apparatus 300 according to the third embodiment are described. In the semiconductor apparatus 300 according to the third embodiment, suppression performance against peeling-off or cracks between the resin insulating layer 2 and the radiator plate 1 can be more enhanced as compared with that in the first embodiment.

Stress causing peeling-off or cracks at the interface between the resin insulating layer 2 and the radiator plate 1 to arise includes the aforementioned stress caused by the difference in linear expansion coefficient between the resin insulating layer 2 and the radiator plate 1, and stress received from the case 8 and the sealing material 10 which are adjacent to the resin insulating layer 2. The semiconductor apparatuses according to the first embodiment of the present invention and the second embodiment of the present invention can suppress the former stress. Meanwhile, the semiconductor apparatus 300 according to the third embodiment of the present invention can suppress the latter stress, in particular, the stress received from the case 8.

An action of the semiconductor apparatus 300 according to the third embodiment which suppresses the stress of the resin insulating layer 2 received from the case 8 is specifically described.

The aforementioned suppressing action is achieved based on a difference between arrangements of the adhesive material 6 in FIG. 2, which is a cross-sectional view of the semiconductor apparatus 100 according to the first embodiment of the present invention, and in FIG. 6, which is a cross-sectional view of the semiconductor apparatus 300 according to the third embodiment of the present invention.

The case 8 expands or contracts when the temperature changes. In the semiconductor apparatus 100 according to the first embodiment of the present invention, when the case 8 expands or contracts, the case 8 distributes and transmits the stress through two paths. One of these is a path through which the stress is transmitted to the resin insulating layer 2 via the adhesive material 6. The other thereof is a path through which the stress is transmitted to the resin insulating layer 2 via the sealing material 10. On the other hand, in the semiconductor apparatus 300 according to the third embodiment of the present invention, when the case 8 expands or contracts, the stress is distributed and transmitted through a path through which the stress is transmitted to the resin block 11 via the adhesive material 6, and through a path through which the stress is transmitted to the resin insulating layer 2 via the sealing material 10.

In other words, in the semiconductor apparatus 100 according to the first embodiment of the present invention, the stress, which the case 8 transmits through the two paths, is received by the resin insulating layer 2 which has a large effect on peeling-off or cracks at the interface between this and the radiator plate 1. In contrast, in the semiconductor apparatus 300 of the third embodiment of the present invention, the stress which the ease 8 transmits can be distributed and received by the resin block 11 which has less effect on peeling-offer cracks at the interface between this and the radiator plate 1 and by the resin insulating layer 2. According to the above, the stress which the case 8 transmits can be distributed and received by the resin block 11 which has less effect on peeling-off or cracks at the interface between the resin insulating layer 2 and the radiator plate 1. Hence, the semiconductor apparatus 300 according to the third embodiment of the present invention can suppress peeling-off or cracks at the interface between the resin insulating layer 2 and the radiator plate 1.

Fourth Embodiment

Figure 7:
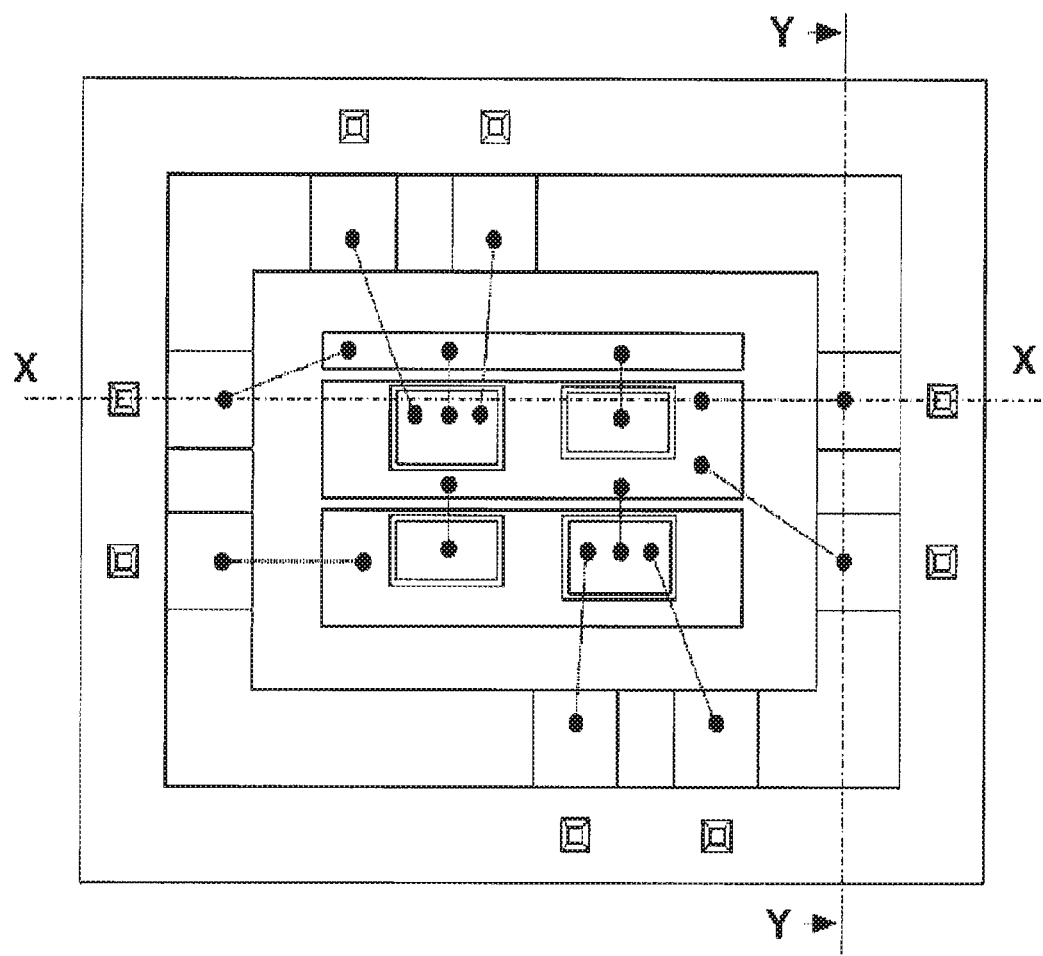
FIG. 7 is a configuration diagram of a semiconductor apparatus according to a fourth embodiment of the present invention.
Figure 8:
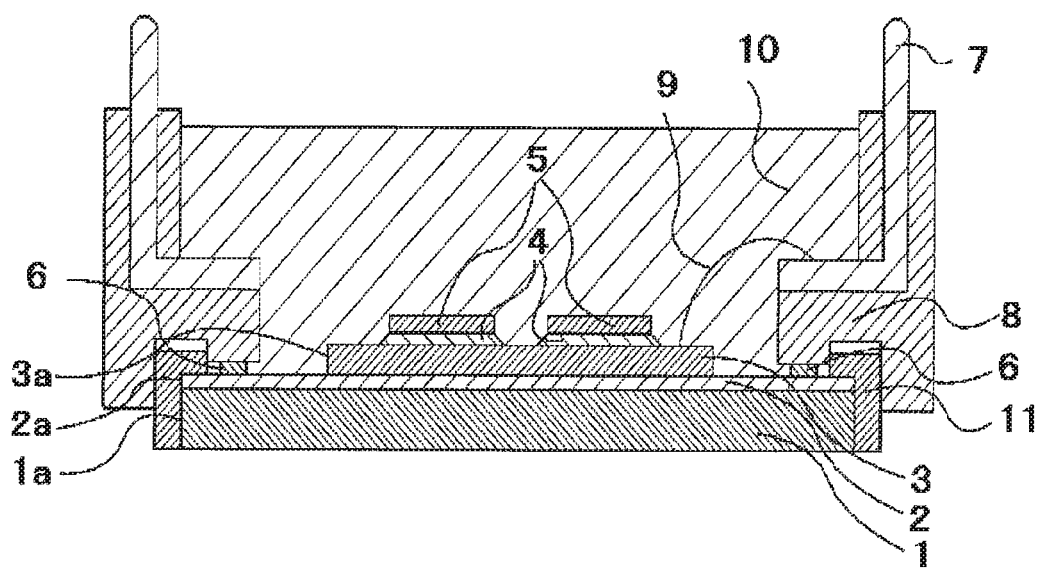
FIG. 8 is a cross-sectional view of a semiconductor apparatus according to a fourth embodiment of the present invention.

FIG. 7 is a configuration diagram of a semiconductor apparatus according to a fourth embodiment of the present invention. FIG. 8 is a cross-sectional view taken along the line X-X illustrated in FIG. 7. A semiconductor apparatus 400 according to the fourth embodiment is different from the semiconductor apparatus according to the first embodiment in the shape of the resin block 11.

In the semiconductor apparatus 100 according to the first embodiment, the resin block 11 is annularly disposed so as to cover the whole peripheries of the end part 1a of the radiator plate 1 and the end part 2a of the resin insulating layer 2. In contrast, in the semiconductor apparatus 400 according to the fourth embodiment of the present invention, the resin block 11 is annularly disposed so as to cover the whole peripheries of the end part 1a of the radiator plate 1 and the end part 2a of the resin insulating layer 2, and furthermore, to cover a periphery on the surface of the resin insulating layer 2. In the case 8, a recess is provided into which the resin block 11 is fitted after bonding, as needed.

Next, operation and effects of the semiconductor apparatus 400 according to the fourth embodiment are described. In the semiconductor apparatus 400 according to the fourth embodiment, the resin block 11 is annularly disposed so as to cover the whole peripheries of the end part 1a of the radiator plate 1 and the end part 2a of the resin insulating layer 2, and furthermore, to cover the periphery on the surface of the resin insulating layer 2. Covering the surface of the resin insulating layer 2 with the resin block 11 enhances bonding force of the resin insulating layer 2 and the resin block 11, which can suppress peeling-off or cracks at the interface between the resin insulating layer 2 and the resin block 11. Moreover, even when, as described in the third embodiment of the present invention, there arises stress of the case 8 and the sealing material 10 pulling the resin insulating layer 2, a movement, between the resin insulating layer 2 and the radiator plate 1, which causes peeling-off or cracks at the interface therebetween can be suppressed. According to the above, suppression performance against peeling-off or cracks between the resin insulating layer 2 and the radiator plate 1 can be more enhanced as compared with that in the first embodiment.

In the first to fourth embodiments of the present invention, the semiconductor devices 5 can also be made of SiC. A SiC semiconductor device has higher thermal conductivity than a Si semiconductor device. This feature enables a semiconductor apparatus using SiC semiconductor devices to be used in higher temperature operation than a Si semiconductor apparatus. In such higher temperature operation, stress and distortion arising between the components become larger due to the difference in linear expansion coefficient between the components constituting the semiconductor apparatus. Hence, the present invention acts effectively in the case of the semiconductor devices 5 being SiC semiconductor devices.

A combination of the first to fourth embodiments of the present invention can enhance suppression performance against peeling-off or cracks between the resin insulating layer 2 and the radiator plate 1.

In the first to fourth embodiments of the present invention, the resin block 11 does not necessarily cover the whole peripheries of the end part 1a of the radiator plate 1 and the end part 2a of the resin insulating layer 2, but may cover those with gaps provided therein as needed.

The first to fourth embodiments of the present invention are effective for the case where an epoxy-based resin for sealing material 10 is used. Bonding force is high between epoxy-based resin and the resin insulating layer 2, and epoxy-based resin has a high Young's modulus. This causes strong pulling stress due to which peeling-off or cracks arise between the resin insulating layer 2 and the radiator plate 1. In such a case, the present invention works effectively since peeling-off or cracks can be suppressed at the interface between the resin insulating layer 2 and the radiator plate 1.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2017-190985, filed on Sep. 29, 2017 including specification, claims, drawings and summary, on which the Convention priority of the present application is based, is incorporated herein by reference in its entirety.

The invention claimed is:

1. A semiconductor apparatus comprising:
a radiator plate;
a resin insulating layer provided on the radiator plate;
a resin block made of resin and annularly disposed to cover an end part of the radiator plate and an end part of the resin insulating layer;
a case disposed to cover the resin block; and
a sealing material filled in an inside of the case,
wherein the resin block is separated from the sealing material by an adhesive material such that a gap is provided between the resin block and the sealing material.

2. The semiconductor apparatus according to claim 1, wherein the end part of the radiator plate has a convex shape at a center part on a lateral face of the end part of the radiator plate, and
the resin block has a concave shape corresponding to the convex shape.

3. The semiconductor apparatus according to claim 2, wherein the resin block is disposed to cover a part of a surface of the resin insulating layer.

4. The semiconductor apparatus according to claim 3, wherein the case is bonded to the resin block via the adhesive material.

5. The semiconductor apparatus according to claim 2, wherein the case is bonded to the resin block via the adhesive material.

6. The semiconductor apparatus according to claim 2, wherein the sealing material is an epoxy-based resin.

7. The semiconductor apparatus according to claim 2, further comprising a wiring layer provided on the resin insulating layer, and a SiC semiconductor device joined to the wiring layer via a solder.

8. The semiconductor apparatus according to claim 1, wherein the resin block is disposed to cover a part of a surface of the resin insulating layer.

9. The semiconductor apparatus according to claim 8, wherein the case is bonded to the resin block via the adhesive material.

10. The semiconductor apparatus according to claim 8, wherein the sealing material is an epoxy-based resin.

11. The semiconductor apparatus according to claim 8, further comprising a wiring layer provided on the resin insulating layer, and a SiC semiconductor device joined to the wiring layer via a solder.

12. The semiconductor apparatus according to claim 1, wherein the case is bonded to the resin block via the adhesive material.

13. The semiconductor apparatus according to claim 12, wherein the sealing material is an epoxy-based resin.

14. The semiconductor apparatus according to claim 12, further comprising a wiring layer provided on the resin insulating layer, and a SiC semiconductor device joined to the wiring layer via a solder.

15. The semiconductor apparatus according to claim 1, wherein the sealing material is an epoxy-based resin.

16. The semiconductor apparatus according to claim 1, further comprising a wiring layer provided on the resin insulating layer, and a SiC semiconductor device joined to the wiring layer via a solder.

17. The semiconductor apparatus according to claim 1, wherein the resin block covers end parts of the radiator plate, the end parts of the radiator plate including every lateral face of the radiator plate.

* * * * *